US008878544B2

(12) United States Patent
Kasashima et al.

(10) Patent No.: US 8,878,544 B2
(45) Date of Patent: Nov. 4, 2014

(54) ELECTRIC LEAKAGE SENSING APPARATUS

(75) Inventors: Masato Kasashima, Nagano (JP);
Masaki Fujii, Nagano (JP); Takeshi Sekine, Aichi (JP); Takahiro Saito, Nagano (JP)

(73) Assignee: Omron Automotive Electronics Co., Ltd., Aichi (JP)

( * ) Notice: Subject to any disclaimer, the term of this patent is extended or adjusted under 35 U.S.C. 154(b) by 236 days.

(21) Appl. No.: 13/612,440

(22) Filed: Sep. 12, 2012

(65) Prior Publication Data
US 2013/0063152 A1   Mar. 14, 2013

(30) Foreign Application Priority Data

Sep. 12, 2011   (JP) .................................. 2011-198061

(51) Int. Cl.
 G01R 31/14   (2006.01)
 G01R 31/02   (2006.01)
 G01R 19/165   (2006.01)
 G01R 31/00   (2006.01)

(52) U.S. Cl.
 CPC ........ G01R 31/025 (2013.01); *G01R 19/16542* (2013.01); *G01R 31/007* (2013.01)
 USPC ...................................................... 324/509

(58) Field of Classification Search
 USPC ................................................ 324/509, 510
 See application file for complete search history.

(56) References Cited

U.S. PATENT DOCUMENTS

| 7,295,016 B2 * | 11/2007 | Kishibata et al. ............. 324/522 |
| 8,749,246 B2 * | 6/2014 | Schaefer ....................... 324/509 |
| 2004/0227521 A1 * | 11/2004 | Higashihama et al. ........ 324/522 |
| 2011/0199223 A1 * | 8/2011 | Akimov et al. ............ 340/636.1 |

FOREIGN PATENT DOCUMENTS

| JP | H07-128387 A | 5/1995 |
| JP | 2004-347372 A | 12/2004 |
| JP | 2005-127821 A | 5/2005 |
| JP | 2007-057490 A | 3/2007 |
| JP | 2007-159289 A | 6/2007 |
| JP | 2007-163291 A | 6/2007 |
| JP | 2010-249766 A | 11/2010 |

OTHER PUBLICATIONS

Patent Abstracts of Japan, Publication No. 2005-127821, Published on May 19, 2005, 1 page.

(Continued)

*Primary Examiner* — Jeff Natalini
*Assistant Examiner* — Demetrius Pretlow
(74) *Attorney, Agent, or Firm* — Osha Liang LLP

(57) ABSTRACT

An electric leakage sensing apparatus includes a coupling capacitor having one end connected to a DC power supply, a pulse generator that supplies a pulse to the other end of the coupling capacitor, a voltage detector that detects a voltage at the coupling capacitor charged by the pulse, an electric leakage determination part that compares the voltage detected by the voltage detector to a threshold value, and makes a determination of existence or non-existence of an electric leakage of the DC power supply based on a comparison result, and a booster circuit that applies a boosted pulse voltage to the coupling capacitor. The pulse generator converts an output voltage of the booster circuit into the pulse voltage. The voltage detector includes an offset voltage generating circuit that generates an offset voltage.

4 Claims, 4 Drawing Sheets

(56) References Cited

OTHER PUBLICATIONS

Patent Abstracts of Japan, Publication No. 2007-163291, Published on Jun. 28, 2007, 1 page.

Patent Abstracts of Japan, Publication No. 2007-159289, Published on Jun. 21, 2007, 1 page.

Office Action dated Jun. 9, 2014 in corresponding Chinese Application No. 201210323734.4 (with translation) (12 pages).

* cited by examiner

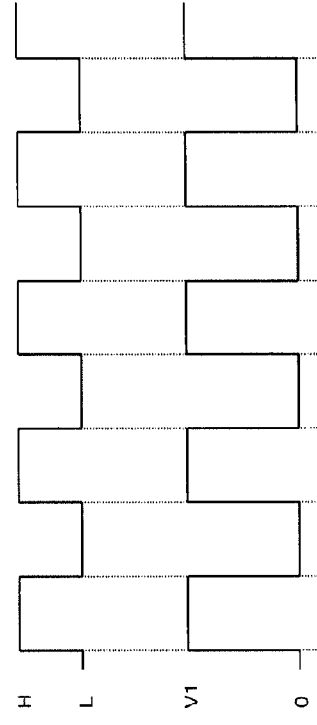
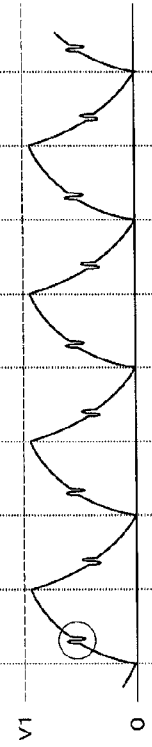
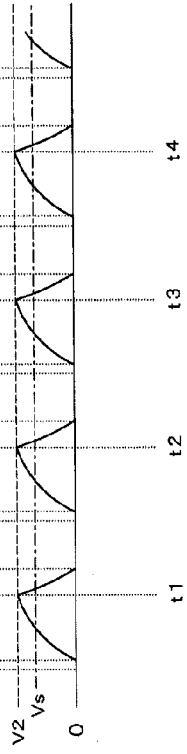
IN THE CASE OF NON-EXISTENCE OF ELECTRIC LEAKAGE
FIG. 2A
CPU OUTPUT
FIG. 2B
SWITCHING ELEMENT OUTPUT
FIG. 2C
FILTER CIRCUIT INPUT (COUPLING CAPACITOR VOLTAGE)
FIG. 2D
FILTER CIRCUIT OUTPUT
FIG. 2E
CALCULATION CIRCUIT OUTPUT

IN THE CASE OF EXISTENCE OF ELECTRIC LEAKAGE

CPU OUTPUT

SWITCHING ELEMENT
OUTPUT

FILTER CIRCUIT INPUT
(COUPLING CAPACITOR
VOLTAGE)

FILTER CIRCUIT OUTPUT

CALCULATION CIRCUIT
OUTPUT

ELECTRIC LEAKAGE SENSING APPARATUS

BACKGROUND OF THE INVENTION

1. Technical Field

The present invention relates to an electric leakage sensing apparatus that is used to sense an electric leakage of a DC power supply in an electric automobile, for example.

2. Related Art

A high-voltage DC power supply is mounted on the electric automobile in order to drive a motor and an in-vehicle instrument. The DC power supply is electrically insulated from a grounded vehicle body. However, when an insulation failure or a short circuit occurs between the DC power supply and the vehicle body for any cause, a current flows through a route from the DC power supply to the ground to generate an electric leakage. Therefore, an electric leakage sensing apparatus that senses the electric leakage is provided in the DC power supply.

There is well known an electric leakage sensing apparatus in which a coupling capacitor is used. The electric leakage sensing apparatus includes: a coupling capacitor in which one end is connected to a DC power supply; a pulse generator that supplies a pulse to the other end of the coupling capacitor; a voltage detector that detects a voltage at the coupling capacitor charged by the pulse; and an electric leakage determination part that compares the voltage detected by the voltage detector to a threshold value, and makes a determination of existence or non-existence of the electric leakage based on the comparison result. Japanese Unexamined Patent Publication Nos. 2005-127821 and 2007-163291 disclose the electric leakage sensing apparatus having such a configuration.

In a technology disclosed in Japanese Unexamined Patent Publication No. 2007-159289, a power supply circuit boosts a charge voltage of a smoothing capacitor by use of energy accumulated in the smoothing capacitor in a power supply part of a motor drive device, and degradation of an insulating property of a motor is detected by applying the boosted voltage between a motor coil and a ground.

When the existence or non-existence of the electric leakage is sensed based on the voltage at the coupling capacitor, sensing accuracy depends on magnitude of the voltage applied to the coupling capacitor. That is, as illustrated in FIG. 4, in the case of a small voltage Va at the coupling capacitor, a variation range α of the capacitor voltage decreases when an electric leakage resistance between the DC power supply and the ground varies by a temperature and the like. That is, there is a limitation to the sensing accuracy because a dynamic range cannot be widened. On the other hand, as illustrated in FIG. 5, in the case of a large voltage Vb at the coupling capacitor, a variation range β of the capacitor voltage increases with respect to the variation in electric leakage resistance. That is, the sensing accuracy is improved because the dynamic range can be widened.

Accordingly, in order to enhance the sensing accuracy, it is necessary to provide a booster circuit, and to apply the voltage boosted by the booster circuit to the coupling capacitor. However, when the voltage at the coupling capacitor increases, the increased voltage exceeds a voltage (for example, 5 V) that can be read by a CPU, and the CPU cannot make the determination of the existence or non-existence of the electric leakage.

SUMMARY

One or more embodiments of the present invention provide an electric leakage sensing apparatus that can normally make the determination of the existence or non-existence of the electric leakage even if the voltage applied to the coupling capacitor is increased in order to enhance the sensing accuracy.

In accordance with one aspect of the present invention, an electric leakage sensing apparatus includes: a coupling capacitor in which one end is connected to a DC power supply; a pulse generator that supplies a pulse to the other end of the coupling capacitor; a voltage detector that detects a voltage at the coupling capacitor charged by the pulse; an electric leakage determination part that compares the voltage detected by the voltage detector to a threshold value, and makes a determination of existence or non-existence of an electric leakage of the DC power supply based on a comparison result, and is further provided with a booster circuit that applies a boosted pulse voltage to the coupling capacitor. The pulse generator converts an output voltage of the booster circuit into the pulse voltage. Furthermore, the voltage detector includes: an offset voltage generating circuit that generates an offset voltage, which is lower than the pulse voltage, based on the output voltage of the booster circuit; and a calculation circuit that outputs a voltage in which the offset voltage is subtracted from the voltage at the coupling capacitor. The electric leakage determination part makes the determination of the existence or non-existence of the electric leakage based on the comparison result between the output voltage of the calculation circuit and the threshold value.

According to the above manner, even if the pulse voltage applied to the coupling capacitor is a highly boosted voltage, the voltage detector outputs the low voltage, in which the offset voltage is subtracted from the voltage at the coupling capacitor, as a detection voltage. Therefore, the detection voltage falls within a range of the voltage that can be read by the electric leakage determination part. As a result, the electric leakage determination part can make normal determination of the existence or non-existence of the electric leakage based on the detection voltage.

In accordance with one or more embodiments of the present invention, the pulse generator may include: a reference voltage generating circuit that generates a constant-voltage reference voltage based on the output voltage of the booster circuit; a switching element that converts the reference voltage into the pulse voltage by performing switching of the reference voltage outputted from the reference voltage generating circuit; and a controller that controls on and off operations of the switching element.

Further, in accordance with one or more embodiments of the present invention, the electric leakage determination part may make the determination of the existence or non-existence of the electric leakage by comparing the output voltage of the calculation circuit to the threshold value at a predetermined timing every time the pulse generator generates the pulse.

Accordingly, one or more embodiments of the present invention can provide the electric leakage sensing apparatus that can normally make the determination of the existence or non-existence of the electric leakage even if the voltage applied to the coupling capacitor is increased in order to enhance the sensing accuracy.

BRIEF DESCRIPTION OF THE DRAWINGS

FIGS. 2A to 2E are waveform charts of signals of parts during a non-electric leakage;

DETAILED DESCRIPTION

Hereinafter, embodiments of the present invention will be described with reference to the drawings. Here, the case that the present invention is applied to an electric leakage sensing apparatus mounted on an electric automobile will be described below by way of example.

Figure 1:
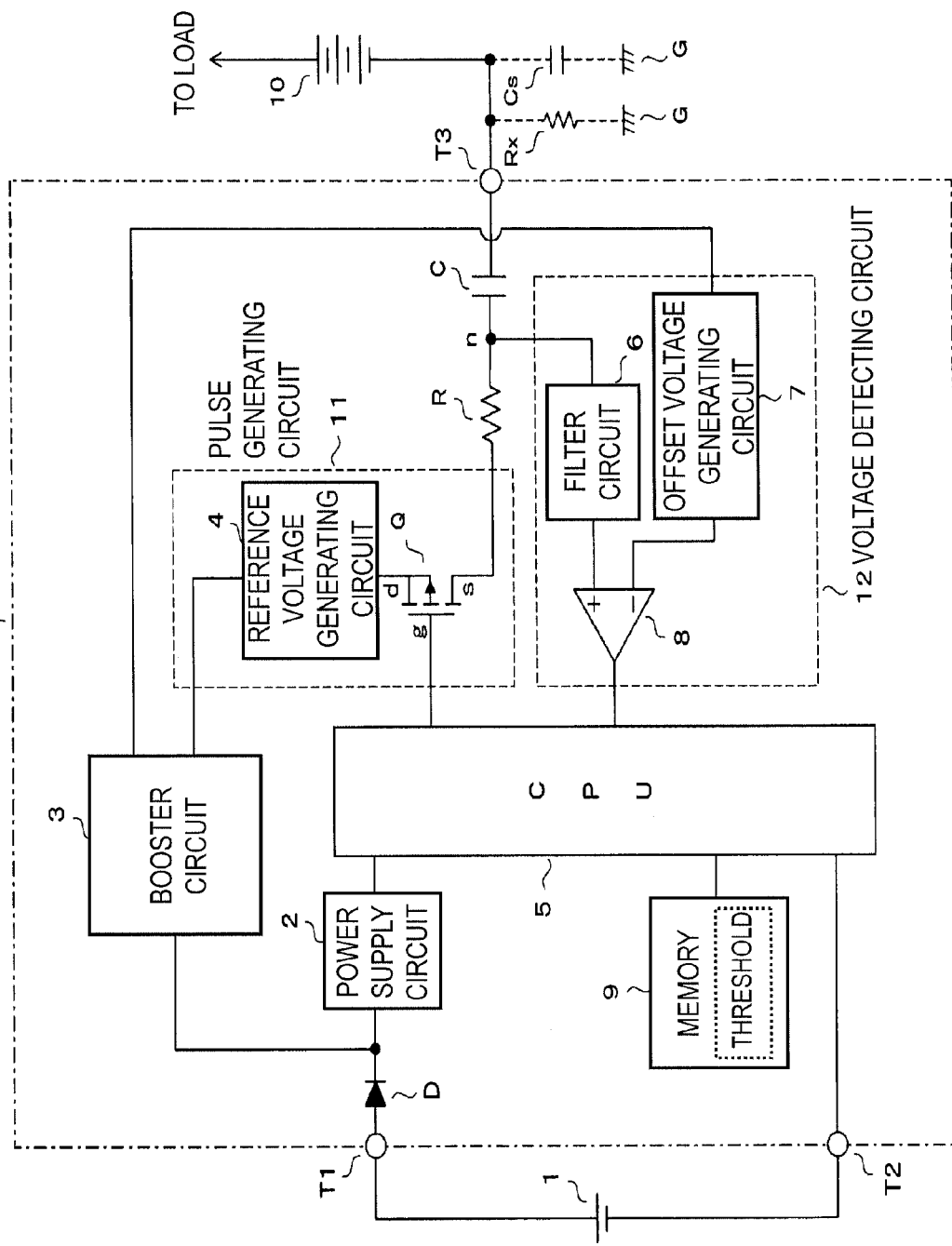
FIG. 1 is a circuit diagram illustrating an electric leakage sensing apparatus according to an embodiment of the present invention.

As illustrated in FIG. 1, an electric leakage sensing apparatus 100 includes a terminal T1 connected to a positive electrode of a drive power supply 1, a terminal T2 connected to a negative electrode of the drive power supply 1, and a terminal T3 connected to a negative electrode of a load power supply 10. For example, the drive power supply 1 is a low-voltage DC power supply including a lead storage battery, and the load power supply 10 is a high-voltage DC power supply including a lithium-ion battery. The load power supply 10 supplies a voltage to each load mounted on a vehicle. A floating capacitance Cs exists between the load power supply 10 and a ground G (vehicle body). An electric leakage resistance Rx is equivalently connected between the load power supply 10 and the ground G upon an electric leakage of the load power supply 10.

The electric leakage sensing apparatus 100 includes a power supply circuit 2, a booster circuit 3, a CPU 5, a memory 9, a pulse generating circuit 11, a voltage detecting circuit 12, a diode D, a resistor R, and a coupling capacitor C. The pulse generating circuit 11 includes a reference voltage generating circuit 4 and a switching element Q. The voltage detecting circuit 12 includes a filter circuit 6, an offset voltage generating circuit 7, and a calculation circuit 8.

The power supply circuit 2 supplies a drive voltage to the CPU 5, and an input side of the power supply circuit 2 is connected to the terminal T1 through the diode D. The booster circuit 3 boosts the voltage of the drive power supply 1, the input side of the booster circuit 3 is connected to the terminal T1 through the diode D, and an output side of the booster circuit 3 is connected to the reference voltage generating circuit 4 and the offset voltage generating circuit 7.

The reference voltage generating circuit 4 generates a constant-voltage reference voltage based on an output voltage of the booster circuit 3, and the output side of the reference voltage generating circuit 4 is connected to the switching element Q. The switching element Q includes an FET (Field Effect Transistor), for example. The switching element Q performs switching of the reference voltage outputted from the reference voltage generating circuit 4, and converts the reference voltage into a pulse voltage. A drain d of the switching element Q is connected to the reference voltage generating circuit 4, a source s is connected to one end of the resistor R, and a gate g is connected to the CPU 5. The CPU 5 controls on and off operations of the switching element Q.

The coupling capacitor C is connected to between the other end of the resistor 5 and the terminal T3. The coupling capacitor C separates the electric leakage sensing apparatus 100 and the load power supply 10 in a direct-current manner. One end of the coupling capacitor C is connected to the negative electrode of the load power supply 10 through the terminal T3. The other end of the coupling capacitor C is connected to the filter circuit 6 while connected to the switching element Q through the resistor R. The filter circuit 6 removes a noise from the voltage at the coupling capacitor C.

The offset voltage generating circuit 7 generates an offset voltage based on the output voltage of the booster circuit 3. The offset voltage is lower than the pulse voltage supplied to the coupling capacitor C. An output of the filter circuit 6 is input to a + terminal of the calculation circuit 8, and an output of the offset voltage generating circuit 7 is input to a − terminal of the calculation circuit 8. The calculation circuit 8 outputs the voltage in which the offset voltage that is of the output of the offset voltage generating circuit 7 is subtracted from the voltage at the coupling capacitor C that is of the output of the filter circuit 6. The output of the calculation circuit 8 is provided to the CPU 5. The CPU 5 determines existence or non-existence of the electric leakage of the load power supply 10 based on a comparison result between the output of the calculation circuit 8 and a threshold value. The threshold value is stored in the memory 9.

As described above, the pulse generating circuit 11 is an example of the "pulse generator" of the present invention. The voltage detecting circuit 12 is an example of the "voltage detector" of the present invention. The CPU 5 is an example of the "electric leakage determination part" and the "controller" of the present invention. The load power supply 10 is an example of the "DC power supply" of the present invention.

Next, an operation of the electric leakage sensing apparatus 100 having the above configuration will be described below. The operation in the case where the electric leakage does not occur between the load power supply 10 and the ground G will be described with reference to FIG. 2.

As illustrated in FIG. 2A, the CPU 5 outputs a control pulse signal having a predetermined frequency. The control pulse signal is provided to the gate g of the switching element Q. Therefore, the switching element Q performs the on and off operations in synchronization with the control pulse signal, and performs the switching of the boosted reference voltage outputted from the reference voltage generating circuit 4, thereby converting the reference voltage into the pulse voltage in FIG. 2B. A peak value V1 of the pulse voltage is substantially equal to the reference voltage. The pulse voltage is supplied to the coupling capacitor C through the resistor R to charge the coupling capacitor C. At this point, the floating capacitance Cs is also charged.

In the case where the electric leakage does not occur, because the electric leakage resistance Rx does not exist between the load power supply 10 and the ground G, the voltage (potential at point n in FIG. 1) at the coupling capacitor C rises steeply by the application of the pulse voltage, and increases close to V1 as illustrated in FIG. 2C. When the pulse voltage is not applied, the charge of the coupling capacitor C discharges, and the voltage at the coupling capacitor C lowers closed to 0 V. Note that a portion surrounded by a circle represent a noise overlapping the voltage waveform.

The voltage at the coupling capacitor C is inputted to the filter circuit 6, where the filter circuit 6 removes the noise. FIG. 2D illustrates a waveform of the output voltage of the filter circuit 6. The output voltage of the filter circuit 6 is inputted to the + terminal of the calculation circuit 8. On the other hand, the offset voltage generating circuit 7 outputs an offset voltage Vo indicated by an alternate long and short dash line in FIG. 2D based on the output voltage of the booster circuit 3. As used herein, Vo<V1 holds. The offset voltage Vo is inputted to the − terminal of the calculation circuit 8.

The calculation circuit 8 subtracts the offset voltage Vo from the output voltage of the filter circuit 6. As a result, as illustrated in FIG. 2E, the calculation circuit 8 outputs the voltage in which a portion above the offset voltage Vo is extracted from the voltage waveform in FIG. 2D. Hereinafter, for the sake of convenience, the output voltage is referred to as a "detection voltage". A peak value V2 of the detection voltage is smaller than the peak value V1 of the pulse voltage. For example, assuming that V1 is set to 15 [V] while Vo is set to 10 [V], V2=V1−Vo=5 [V] is obtained, and the detection voltage falls within a range of the voltage that can be read by the CPU 5.

The CPU 5 compares the detection voltage read from the output of the calculation circuit 8 to the threshold value stored in the memory 9. The threshold value is indicated as Vs in FIG. 2E. As a result of the comparison, when the detection voltage is greater than or equal to the threshold value Vs, the CPU 5 determines that the electric leakage does not occur between the load power supply 10 and the ground G. On the other hand, when the detection voltage is less than the threshold value Vs, the CPU 5 determines that the electric leakage occurs between the load power supply 10 and the ground G. In the case in FIG. 2E, since the detection voltage is greater than or equal to the threshold value Vs, the CPU 5 determines that the electric leakage does not occur.

The determination of the existence or non-existence of the electric leakage is made every time the pulse in FIG. 2B is generated. In the present embodiment, at the time (t1, t2, t3, . . . ) when the pulse falls, the CPU 5 reads the output of the calculation circuit 8, and compares the output to the threshold value Vs to determine the existence or non-existence of the electric leakage. Therefore, the number of times of the electric leakage determination can be increased to quickly sense the electric leakage. The determination may be made immediately before the pulse falls.

Next, the operation in the case where the electric leakage occurs between the load power supply 10 and the ground G will be described with reference to FIG. 3.

Figure 3A:
FIGS. 3A to 3E are waveform charts of signals of the parts during an electric leakage.
Figure 3B:
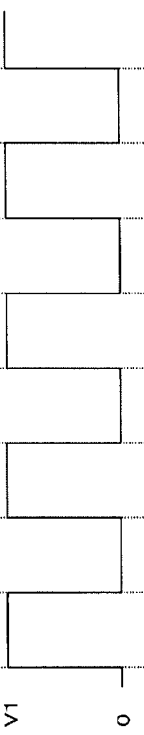

The CPU 5 outputs the control pulse signal in FIG. 3A, and the switching element Q performs the switching of the output (reference voltage) of the reference voltage generating circuit 4 in synchronization with the control pulse signal to output the pulse voltage in FIG. 3B. The pulse voltage is supplied to the coupling capacitor C through the resistor R to charge the coupling capacitor C. At this point, the floating capacitance Cs is also charged. The above points are identical to those in FIG. 2.

Figure 3C:
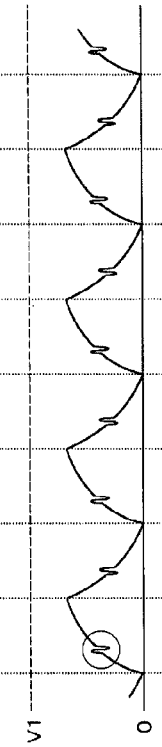

In the case where the electric leakage occurs, the electric leakage resistance Rx exists between the load power supply 10 and the ground G, and a charge current of the coupling capacitor C also flows through the electric leakage resistance Rx. Therefore, as illustrated in FIG. 3C, the voltage (potential at point n in FIG. 1) at the coupling capacitor C rises relatively gently by the application of the pulse voltage, but the voltage does not attain close to V1. When the pulse voltage is not applied, the charge of the coupling capacitor C discharges, and the voltage at the coupling capacitor C lowers closed to 0 V. The portion surrounded by the circle expresses the noise overlapping the voltage waveform.

Figure 3D:
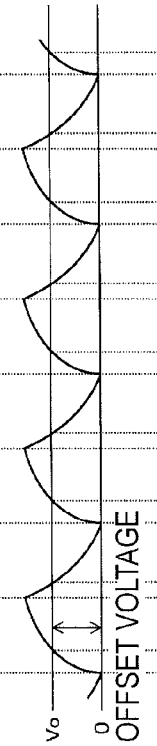

Similarly to the case in FIG. 2, the voltage at the coupling capacitor C is inputted to the filter circuit 6, where the filter circuit 6 removes the noise. FIG. 3D illustrates a waveform of the output voltage of the filter circuit 6. The calculation circuit 8 subtracts the offset voltage Vo from the output voltage of the filter circuit 6. As a result, the calculation circuit 8 outputs the detection voltage in FIG. 3E. A peak value V3 of the detection voltage is further smaller than the peak value V2 of the detection voltage in FIG. 2E. Accordingly, the detection voltage outputted from the calculation circuit 8 falls within the range of the voltage that can be read by the CPU 5.

Figure 3E:
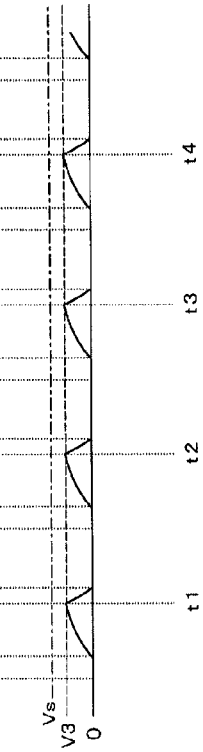
Figure 4:
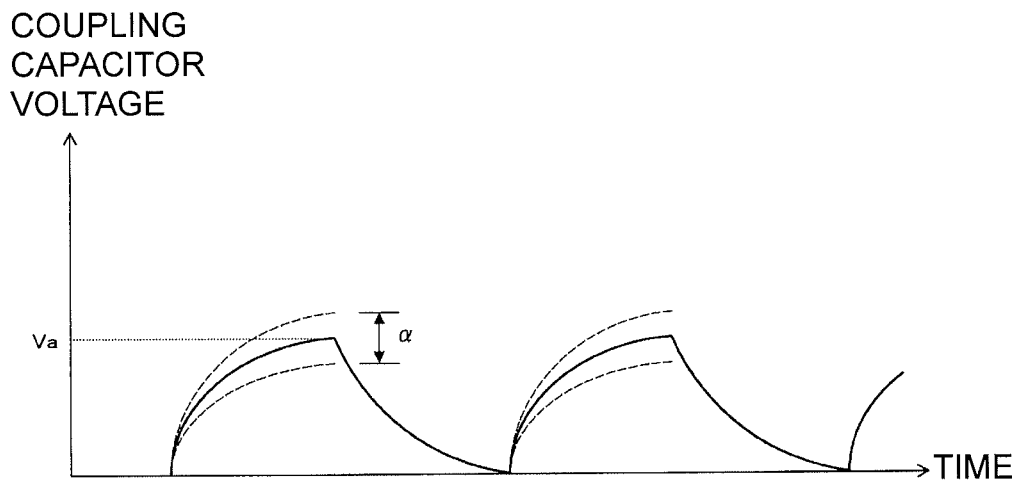
FIG. 4 is a view illustrating a dynamic range in the case of a small applied voltage of a coupling capacitor.
Figure 5:
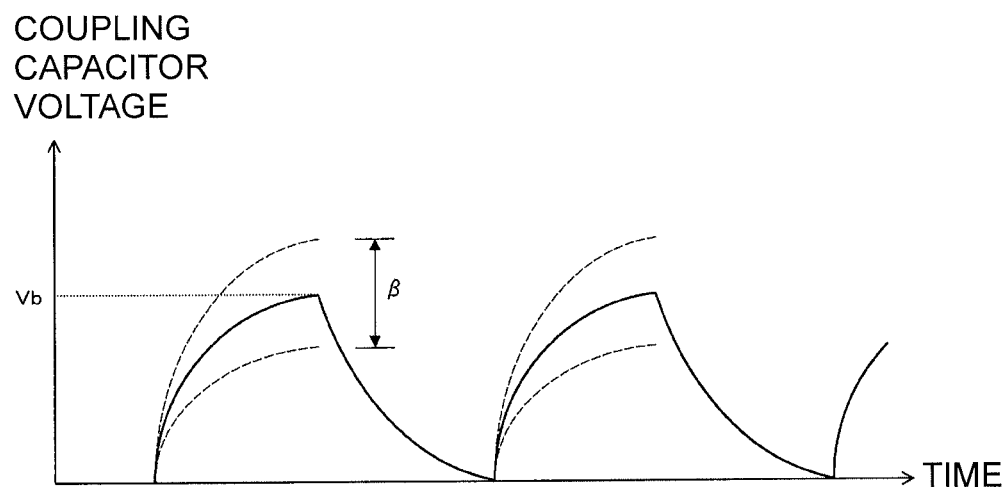
FIG. 5 is a view illustrating a dynamic range in the case of a large applied voltage of a coupling capacitor.

As illustrated in FIG. 3E, the detection voltage is smaller than the threshold value Vs. Accordingly, the CPU 5 determines that the electric leakage occurs between the load power supply 10 and the ground G. When determining that the electric leakage occurs, the CPU 5 notifies a superordinate apparatus of the occurrence of the electric leakage through a communication line (not illustrated).

As described above, according to the present embodiment, even if the pulse voltage applied to the coupling capacitor C is the high voltage boosted by the booster circuit 3, the detection voltage outputted from the calculation circuit 8 is the low voltage in which the offset voltage Vo is subtracted from the voltage at the coupling capacitor C. Therefore, the detection voltage falls within the range of the voltage that can be read by the CPU 5. As a result, even if the pulse voltage is raised in order to enhance electric leakage sensing accuracy, the CPU 5 can normally determine the existence or non-existence of the electric leakage.

In addition to the above embodiment, various modifications can be made in the present invention. For example, in the configuration in FIG. 1, the voltage at the coupling capacitor C is inputted to the calculation circuit 8 through the filter circuit 6. Alternatively, the filter circuit 6 may be eliminated in the case where an influence of the noise is out of the question.

In the configuration in FIG. 1, the output of the booster circuit 3 is directly inputted to the offset voltage generating circuit 7. Alternatively, the output of the reference voltage generating circuit 4 may be inputted to the offset voltage generating circuit 7.

In the configuration in FIG. 1, the FET is used as the switching element Q. Alternatively, a general bipolar transistor may be used instead of the FET. Alternatively, a relay may be used as the switching element Q.

In FIGS. 2 and 3, by way of example, the determination of the existence or non-existence of the electric leakage is made every time the CPU 5 generates the control pulse signal. For example, the determination of the existence or non-existence of the electric leakage may be made every second period of the control pulse signal.

Further, in the above embodiment, by way of example, the present invention is applied to the electric leakage sensing apparatus mounted on the vehicle. Alternatively, the present invention may be applied to an electric leakage sensing apparatus that is used in applications other than the vehicle.

Although the disclosure has been described with respect to only a limited number of embodiments, those skilled in the art, having benefit of this disclosure, will appreciate that other embodiments can be devised which do not depart from the scope of the present disclosure. Accordingly, the scope of the present disclosure should be limited only by the attached claims.

What is claimed is:
1. An electric leakage sensing apparatus comprising:
 a coupling capacitor having one end connected to a DC power supply;
 a pulse generator that supplies a pulse to the other end of the coupling capacitor;
 a voltage detector that detects a voltage at the coupling capacitor charged by the pulse;
 an electric leakage determination part that compares the voltage detected by the voltage detector to a threshold value, and makes a determination of existence or non-existence of an electric leakage of the DC power supply based on a comparison result; and
 a booster circuit that applies a boosted pulse voltage to the coupling capacitor, wherein the pulse generator converts an output voltage of the booster circuit into the pulse voltage, the voltage detector includes an offset voltage generating circuit that generates an offset voltage, which is lower than the pulse voltage, based on the output voltage of the booster circuit and a calculation circuit that outputs a voltage in which the offset voltage is subtracted from the voltage at the coupling capacitor, and the electric leakage determination part makes the determination of the existence or non-existence of the electric leakage based on the comparison result between the output voltage of the calculation circuit and the threshold value.

2. The electric leakage sensing apparatus according to claim 1, wherein the pulse generator comprises:

a reference voltage generating circuit that generates a constant-voltage reference voltage based on the output voltage of the booster circuit;

a switching element that converts the reference voltage into the pulse voltage by performing switching of the reference voltage outputted from the reference voltage generating circuit; and a controller that controls on and off operations of the switching element.

3. The electric leakage sensing apparatus according to claim 1, wherein the electric leakage determination part makes the determination of the existence or non-existence of the electric leakage by comparing the output voltage of the calculation circuit to the threshold value at predetermined timing every time the pulse generator generates the pulse.

4. The electric leakage sensing apparatus according to claim 2, wherein the electric leakage determination part makes the determination of the existence or non-existence of the electric leakage by comparing the output voltage of the calculation circuit to the threshold value at predetermined timing every time the pulse generator generates the pulse.

* * * * *